(12) United States Patent
Aug et al.

(10) Patent No.: US 6,284,644 B1
(45) Date of Patent: Sep. 4, 2001

(54) IMD SCHEME BY POST-PLASMA TREATMENT OF FSG AND TEOS OXIDE CAPPING LAYER

(75) Inventors: Arthur Khoon Siah Aug; Feng Chen; Qiong Li, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/684,518

(22) Filed: Oct. 10, 2000

(51) Int. Cl.$^7$ ................................................. H01L 21/4763
(52) U.S. Cl. ........................ 438/623; 438/637; 438/789
(58) Field of Search ................................ 438/623, 637, 438/789, 780, 781, 788, 624, 669, 656, 763; 257/635, 636, 640, 647, 648

(56) References Cited

U.S. PATENT DOCUMENTS

| | | | |
|---|---|---|---|
| 5,244,535 | 9/1993 | Ohtsuka et al. | 156/643 |
| 5,571,572 | * 11/1996 | Sandhu et al. | 427/585 |
| 5,578,524 | 11/1996 | Fukase et al. | 437/195 |
| 5,643,407 | 7/1997 | Chang | 156/644.1 |
| 5,763,010 | 6/1998 | Guo et al. | 427/376.2 |
| 6,008,120 | 12/1999 | Lee | 438/634 |
| 6,028,013 | 2/2000 | Annapragada et al. | 438/783 |
| 6,035,803 | 3/2000 | Robles et al. | 118/723 E |
| 6,054,379 | * 4/2000 | Yau et al. | 438/623 |
| 6,072,227 | * 6/2000 | Yau et al. | 257/642 |
| 6,130,157 | * 10/2000 | Liu et al. | 438/637 |
| 6,136,680 | * 10/2000 | Lai et al. | 438/597 |
| 6,153,512 | * 11/2000 | Chang et al. | 438/624 |

* cited by examiner

Primary Examiner—Michael Lebentritt
(74) Attorney, Agent, or Firm—George O. Saile; Rosemary L. S. Pike; Stephen G. Stanton

(57) ABSTRACT

A method of forming a metal interconnect within a fluorinated silica glass dielectric layer while preventing outgassing from the FSG dielectric layer, comprising the following steps. A semiconductor structure having a metal structure, with an overlying liner layer, formed thereover is provided. A FSG dielectric layer is formed over the liner layer. The FSG dielectric layer having an exposed upper surface. The FSG dielectric layer is treated with a first nitrogen gas/plasma treatment to form a fluorine depleted upper capping layer from the exposed surface of the FSG dielectric layer. A TEOS oxide layer is formed over the upper capping layer. The TEOS oxide layer is planarized to form a planarized TEOS oxide layer. The planarized TEOS oxide layer, the upper capping layer, the treated FSG dielectric layer, and the liner layer are patterned to form a via hole therethrough, exposing a portion of the metal structure and exposing sidewalls of the patterned treated FSG dielectric layer within the via opening. At least the exposed sidewalls of the patterned treated fluorinated silicon glass dielectric layer within the via opening is treated with a second nitrogen gas/plasma treatment to form a fluorine depleted sidewall capping layer from the exposed sidewalls of the patterned treated fluorinated silicon glass dielectric layer, wherein the upper and sidewall capping layers prevent the outgassing from the patterned FSG dielectric layer. A metal interconnect is formed within the via opening.

44 Claims, 4 Drawing Sheets

IMD SCHEME BY POST-PLASMA TREATMENT OF FSG AND TEOS OXIDE CAPPING LAYER

BACKGROUND OF THE INVENTION

Fluorinated silica glass (FSG) is employed as a low dielectric constant (low-k) material for intermetal dielectric (IMD) layers for semiconductor technology of 0.18 µm and beyond (i.e. smaller sizes). However, complications in process integration may arise including:

(1) metal (e.g. Al) can be attacked by F-species leading to the formation of metal fluoride (e.g. $AlF_3$);

(2) good planarity by chemical mechanical polishing (CMP) is usually achieved by polishing more FSG thus increasing the cost of the, already, expensive materials; and (3) the current scheme (method) employing SRO as a capping layer is unstable and is causing the problem of depth of focus (DOF) during patterning of the via mask resulting in poor critical dimension (CD) uniformity.

The above problems can escalate to bad process integration at back-end-of-line (BEOL) processes.

U.S. Pat. No. 6,008,120 to Lee describes a metal line, liner layer, FSG and an oxide layer, and a via.

U.S. Pat. No. 6,028,013 to Annapragada et al. describes a metal, FSG and (PECVD) oxide layer.

U.S. Pat. No. 5,763,010 to Guo et al. describes a method of stabilizing halogen-doped silicon oxide film to reduce halogen atoms migrating from the film during subsequent processing steps. A halogen-doped film is deposited over a substrate and is then subjected to a degassing step by briefly heating the film to between about 300 and 550° C. before deposition of a diffusion barrier layer. The heat treatment is thought to remove loosely bonded halogen atoms from the halogen-doped film. In a preferred embodiment, the halogen-doped silicon oxide film is FSG film that is subjected to a degassing treatment for between about 35 and 50 seconds.

U.S. Pat. No. 5,244,535 to Ohtsuka et al. describes a method of manufacturing a semiconductor device including a nitrogen-containing plasma treatment of contact holes. The contact holes are etched through an insulation layer (for example $SiO_2$) with a fluorine-based gaseous plasma, and the contact holes are then immediately flooded with the nitrogen-containing plasma that inhibits formation of reaction products on the exposed portion of the contact holes.

U.S. Pat. No. 5,643,407 to Chang describes a method of forming via openings through an intermetal dielectric (IMD) layer (comprised of spin-on-glass (SOG) sandwiched between two layers of silicon oxide ($SiO_2$)) to an underlying patterned first metal layer. A vacuum bake is used to remove moisture from the exposed SOG layer within the via opening and then a nitrogen plasma treatment converts the SOG layer from an organic to an inorganic material. The inorganic SOG layer material has less moisture absorption, and suppresses outgassing from the rest of the organic SOG layer to prevent poisoned via metallurgy.

U.S. Pat. No. 5,578,524 to Fukase et al. describes an intermediate insulation layer between a wiring of gate electrodes and a wiring formed in an upper layer that includes a first interlayer insulation layer, a silicon rich oxide layer stacked on the first interlayer insulation layer and containing excessive silicon atoms. A second interlayer insulation layer is stacked over the silicon rich oxide layer. A selective dry etching process is used to etch the insulation layers to simultaneously form a self-aligned type contact hole on the diffusion layer position at the gap between oppositely arranged gate electrodes and a contact hole on the wiring of the predetermined gate electrode.

U.S. Pat. No. 6,035,803 to Robles et al. describes a method and apparatus for controlling the deposition of a fluorinated carbon film. A carbon-based dielectric film is deposited on a substrate in a processing chamber by first flowing a process gas including a gaseous source of carbon (e.g. $CH_4$) and a gaseous source of halogen (e.g. $C_4F_8$). A plasma is then formed from the process gas by applying a first and then second RF power component for a period of time to deposit a halogen-doped carbon-based layer.

U.S. Pat. No. 6,054,379 to Yau et al. describes a method and apparatus for depositing a low dielectric constant film by reaction of an organo silane compound and an oxidizing gas.

SUMMARY OF THE INVENTION

Accordingly, it is an object of the present invention to provide a method of forming a via opening in an IMD layer including a fluorinated silica glass (FSG) dielectric sublayer while preventing outgassing from the FSG dielectric sublayer.

Another object of the present invention is to provide a method of forming a via opening within an IMD layer including a first treated FSG dielectric sublayer then subjecting the via opening to a second treatment to treat the exposed sidewalls of the first treated FSG dielectric sublayer while depleting fluorine species on the exposed surface of the fluorinated silica glass dielectric layer within the via opening to prevent outgassing from the FSG dielectric sublayer.

Other objects will appear hereinafter.

It has now been discovered that the above and other objects of the present invention may be accomplished in the following manner. Specifically, a semiconductor structure having a metal structure formed thereover is provided. A liner layer is formed over the semiconductor structure, covering the metal structure. A fluorinated silica glass dielectric layer is formed over the liner layer. The fluorinated silica glass dielectric layer having an exposed upper surface. The fluorinated silica glass dielectric layer is treated with a first nitrogen gas/plasma treatment to form a fluorine depleted upper capping layer from the exposed surface of the fluorinated silica glass dielectric layer. A TEOS oxide layer is formed over the upper capping layer. The TEOS oxide layer is planarized to form a planarized TEOS oxide layer. The planarized TEOS oxide layer, the upper capping layer, the treated fluorinated silica glass dielectric layer, and the liner layer are patterned to form a via hole therethrough, exposing a portion of the metal structure and exposing sidewalls of the patterned treated fluorinated silica glass dielectric layer within the via opening. At least the exposed sidewalls of the patterned treated fluorinated silicon glass dielectric layer within the via opening is treated with a second nitrogen gas/plasma treatment to form a fluorine depleted sidewall capping layer from the exposed sidewalls of the patterned treated fluorinated silicon glass dielectric layer, wherein the upper and sidewall capping layers prevent the outgassing from the patterned fluorinated silica glass dielectric layer. A metal interconnect is formed within the via opening.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Initial Structure and Formation of SRO Liner Layer

Figure 1:
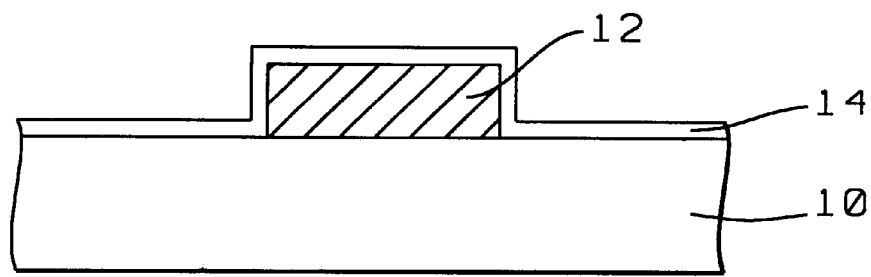
FIGS. 1 through 8 schematically illustrate in cross-sectional representation a preferred embodiment of the present invention.

Accordingly as shown in FIG. 1, starting semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

At least one metal structure 12 is formed over semiconductor structure 10 so as to contact an underlying semiconductor device/interconnect line (not shown). Metal structure 12 is preferably a metal line and may be comprised of aluminum, copper, an Al/Cu alloy, or an Al/Cu/Si alloy, and is preferably aluminum (Al).

As shown in FIG. 1, liner layer 14 is formed upon semiconductor structure 10 and metal line 12. Liner layer 14 may be comprised of USG, PSG, BPSG, or SRO, and is preferably SRO as will be used hereafter for illustrative purposes.

Liner layer 14 is preferably from about 100 to 700 Å thick, and is more preferably from about 200 to 500 Å thick.

Formation of FSG Layer

Figure 2:
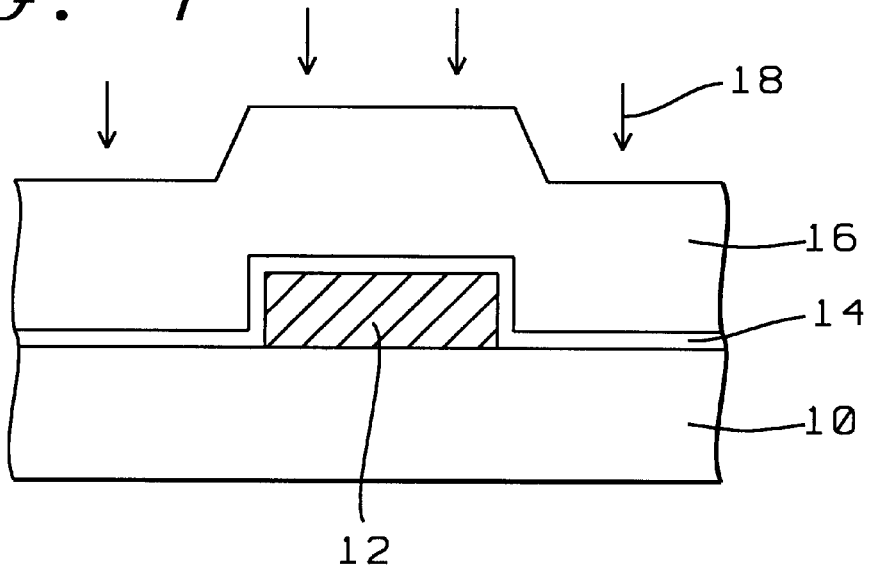
Figure 3:
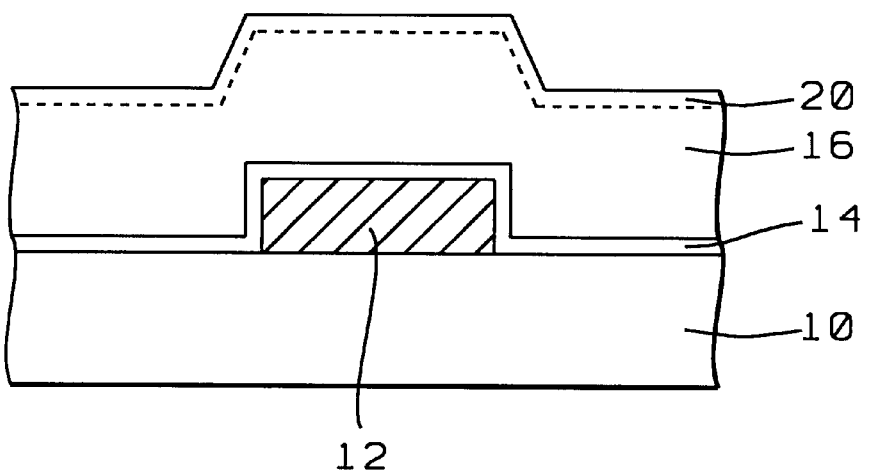

As shown in FIG. 2, fluorinated silica glass (FSG) layer 16 is formed upon SRO liner layer 14. FSG layer 16 is preferably deposited by a PECVD or HDCVD process, and is more preferably deposited by a PECVD process using a PECVD tool manufactured by AMAT or Novellus.

FSG layer 16 is preferably from about 400 to 10,000 Å thick and is more preferably from about 9000 to 5000 Å thick. The concentration of fluorine (F) within FSG layer 16 is from about 4 to 10 atom %, more preferably from about 5 to 8 atom %, and most preferably from about 6 to 7.5 atom %.

Formation of Upper Capping Layer

FSG layer 16 is then subjected to a post-plasma first treatment 18, i.e. a first nitrogen gas/plasma treatment 18, to form upper capping layer 20 from the exposed upper surface of FSG layer 16. Upper capping layer 20 is preferably from about 50 to 500 Å thick, and more preferably from about 100 to 300 Å thick.

It is proposed that first nitrogen gas/plasma treatment 18 reduces the surface concentration of F to define upper capping layer 20. The concentration of fluorine (F) within upper capping layer 20 is reduced to from about 0 to 0.2 atom %, more preferably from about 0 to 0.1 atom %, and most preferably from about 0 to 0.05 atom %. The concentration of fluorine (F) within upper capping layer 20 is reduced to preferably from about 0 to 2%, and more preferably from about 0 to 0.66% of the F concentration within FSG layer 16.

First nitrogen gas/plasma treatment 18 preferably comprises an $N_2$ plasma, an $NH_3$ plasma, an $NH_2$—$NH_2$ plasma, one of the above plasmas with an $H_2$ plasma, or a combination of two or more of the above plasmas with or without an $H_2$ plasma.

The stoichiometric ratio of H to N present in the N-containing plasma is from about 0 to 10, and more preferably from about 0.5 to 6.

First nitrogen gas plasma treatment 18 treats FSG layer 16 at the following parameters:

temperature: from about 0 to 520° C., and more preferably from about 20 to 450° C.;

pressure: from about 0.001 to 10 Torr, and more preferably from about 0.005 to 5 Torr;

power: from about 20 to 2000 W, and more preferably from about 50 to 1000 W;

time: from about 3 to 300 seconds, and more preferably from about 10 to 150 seconds; and tools: a PECVD, HDCVD or plasma etcher.

Alternatively, FSG layer 16 may be treated by an H-plasma to also form upper capping layer 20.

Formation of TEOS Oxide Layer

Figure 4:
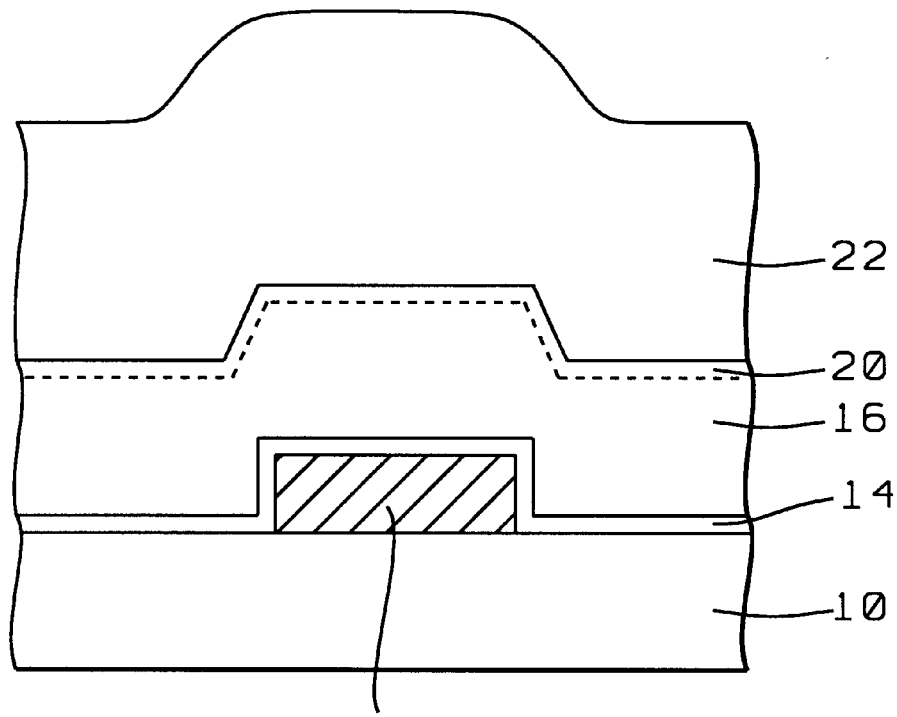

As shown in FIG. 4, silicon oxide (oxide) layer 22 is formed over upper capping layer 20 to a thickness of preferably from about 14,000 to 18,000 Å, and more preferably from about 15,000 to 17,000 Å. Oxide layer 22 may preferably be formed the following starting materials: silane or TEOS, and is more preferably formed from TEOS to form TEOS oxide layer 22.

It is noted that TEOS oxide layer 22 is formed over FSG layer 16 and upper capping layer 20 instead of adding an additional FSG layer. The inventors have discovered that by using TEOS oxide layer 22 instead of an additional FSG layer, CMP planarization is easier, faster, and less expensive.

Planarization of TEOS Oxide Layer

Figure 5:
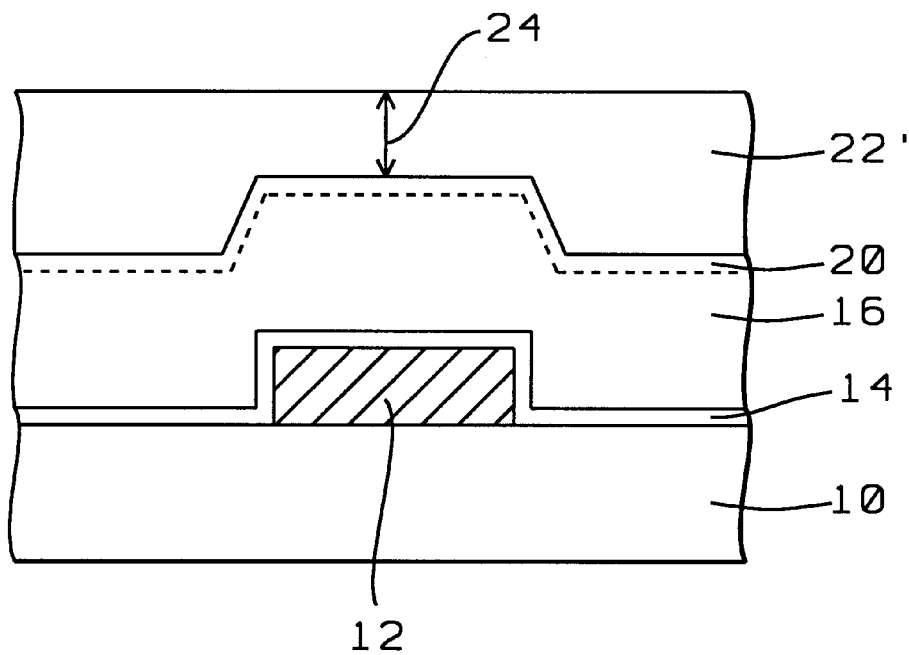

As shown in FIG. 5, TEOS oxide layer 22 is planarized, preferably by chemical mechanical polishing (CMP), to form planarized TEOS oxide layer 22'. Planarized TEOS oxide layer 22' preferably has a thickness 24 of preferably from about 1000 to 5000 Å, and more preferably from about 2000 to 4000 Å.

Formation of Via Hole

Figure 6:
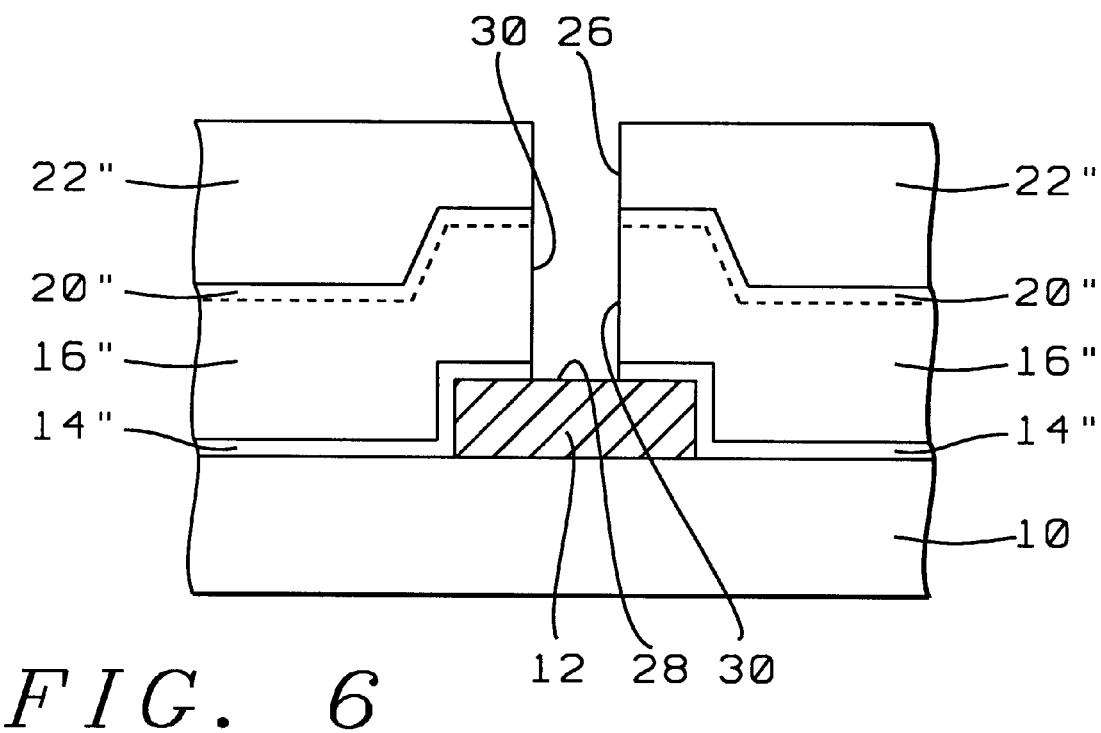

As shown in FIG. 6, planarized TEOS oxide layer 22', upper capping layer 20, FSG layer 16, and SRO liner layer 14 are etched to form via hole 26 through etched TEOS oxide layer 22", etched upper capping layer 20", etched FSG layer 16", and etched SRO liner layer 14" exposing at least a portion 28 of metal line 12. Via hole 26 also exposes sidewalls 30 of etched TEOS oxide layer 22", etched FSG layer 16", etched upper capping layer 20", and etched SRO liner layer 14".

Via hole 26 is preferably from about 1800 to 3000 Å wide, and more preferably from about 2000 to 2600 Å wide.

Etching of via hole 26 may be done, for example, by forming a photoresist layer (not shown) over planarized TEOS oxide layer 22' and patterning the photoresist to form a photoresist mask. The photoresist mask could then be used to etch planarized TEOS oxide layer 22', upper capping layer 20, FSG layer 16, and SRO liner layer 14 to form via opening 26. The photoresist layer would then be stripped and removed.

Second Nitrogen Gas/Plasma Treatment of Exposed Sidewalls of Etched FSG Layer

Figure 7:
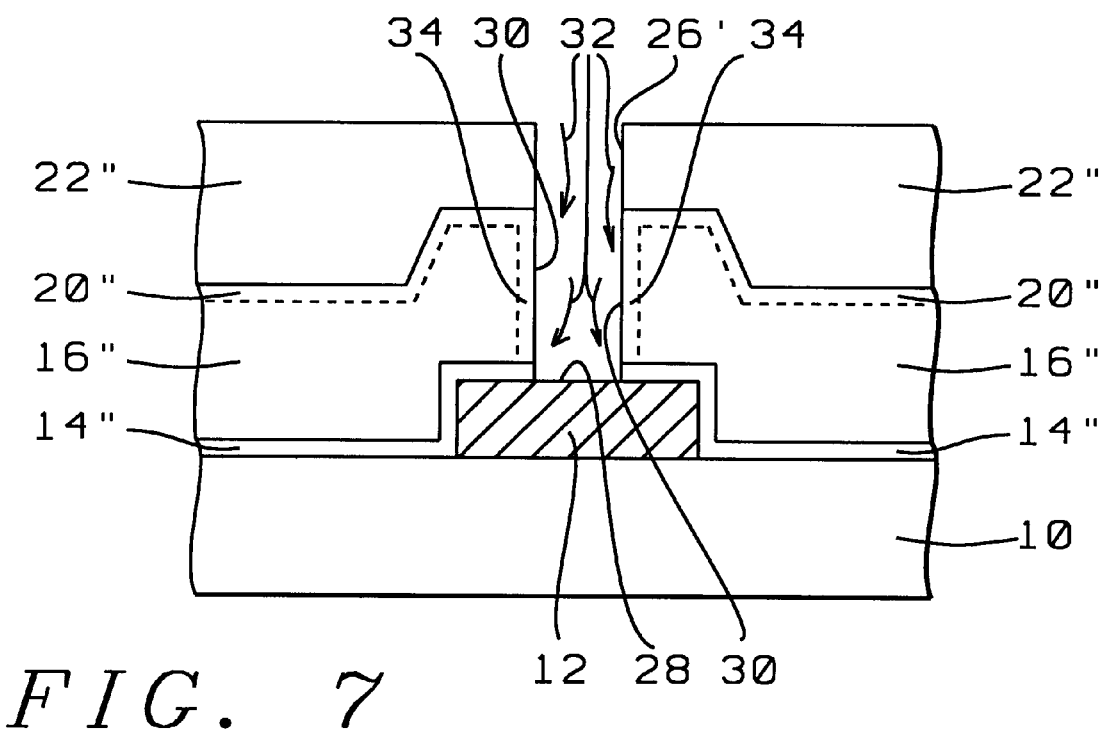

As shown in FIG. 7, at least the sidewalls 30 of via hole 26 are treated with a second nitrogen gas/plasma treatment 32 to form sidewall capping layer 34 from the exposed sidewalls 30 of etched FSG layer 16". Sidewall capping layer 34 is preferably from about 50 to 500 Å thick, and more preferably from about 100 to 300 Å thick.

It is proposed that second nitrogen gas/plasma treatment 32 reduces the surface concentration of F to define sidewall capping layer 34. The concentration of fluorine (F) within sidewall capping layer 34 is reduced to from about 0 to 0.2 atom %, more preferably from about 0 to 0.1 atom %, and most preferably from about 0 to 0.05 atom %. The concentration of fluorine (F) within sidewall capping layer 34 is reduced to preferably from about 0 to 2%, and more preferably from about 0 to 0.66% of the F concentration within FSG layer 16.

Second nitrogen gas/plasma treatment 32 preferably has the same composition as first nitrogen gas/plasma treatment 18. Second nitrogen gas/plasma treatment 32 treats at least the sidewalls 30 of via hole 26, to form sidewall capping layer 34, under analogous conditions as first nitrogen gas/plasma treatment 18 treats FSG layer 16 to form upper capping layer 20 (see above).

Problem the Invention Solves

The inventors have found that absent further processing, F would outgas, or diffuse, from etched FSG layer 16" to and through exposed sidewalls 30 of etched FSG layer 16" into via hole 26 and react with any metal interconnect 36 formed within via hole 26 (see below) to form metal fluoride compounds. Such metal fluoride compounds would deleteriously affect the conductivity of the metal interconnect 36, and thus the semiconductor devices.

Formation of Metal Interconnect

Figure 8:
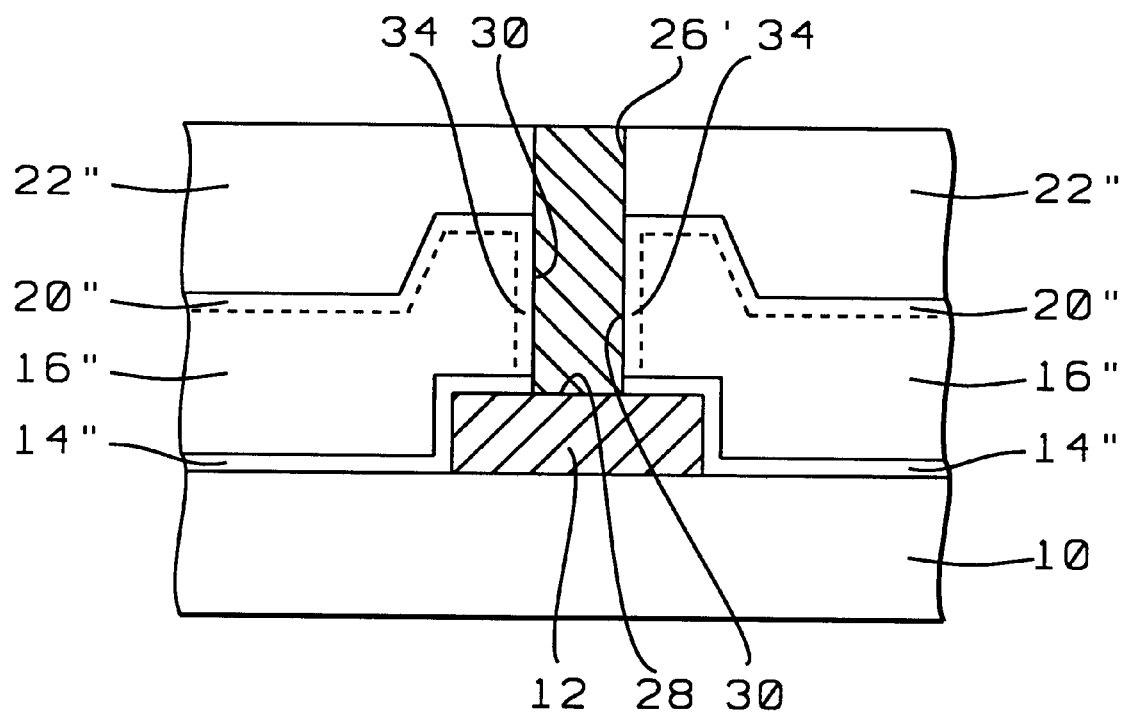

As shown in FIG. 8, a layer of metal is deposited over etched TEOS oxide layer 22", filling second nitrogen gas treated via hole 26'.

The metal layer is planarized to remove the excess of the metal from the upper surface of etched TEOS oxide layer 22", forming planarized metal interconnect 66 within via opening 26'.

Metal interconnect 36 may be comprised of aluminum, copper, or tungsten, and is preferably tungsten.

Sidewall capping layer 34 and upper capping layer 20" serve as a barrier layer to etched FSG layer 16" and blocks outgassing or diffusing of F species from etched FSG layer 16" to metal interconnect 36, thus preventing formation of undesired metal fluorides that affect the electrical resistance and performance of metal interconnect 36.

Advantages of the Present Invention

The advantages of the method of the present invention include:

(1) improvement of protection of a metal plug or interconnect formed within a via opening by an ultra-thin (about 160 Å thick) capping layer of F-depleted oxide. This ultra thin capping layer can be extended to the sidewall of the via hole;

(2) reducing the cost of ownership of the process (by polishing TEOS oxide rather than FSG to achieve good planarity after CMP);

(3) eliminating use of an SRO capping layer and solving the problem of via masking, resulting in good critical dimension (CS); and (4) preservation of low-k property of FSG without the use of an SRO capping layer.

While particular embodiments of the present invention have been illustrated and described, it is not intended to limit the invention, except as defined by the following claims.

We claim:

1. A method of forming a metal interconnect within a fluorinated silica glass dielectric layer while preventing outgassing from said fluorinated silica glass dielectric layer, comprising the steps of:

providing a semiconductor structure having a metal structure formed thereover;

forming a liner layer over said semiconductor structure, covering said metal structure;

forming a fluorinated silica glass dielectric layer over said liner layer; said fluorinated silica glass dielectric layer having an exposed upper surface;

treating said fluorinated silica glass dielectric layer with a first nitrogen gas/plasma treatment to form a fluorine depleted upper capping layer from said exposed surface of said fluorinated silica glass dielectric layer;

forming a TEOS oxide layer over said upper capping layer;

planarizing said TEOS oxide layer to form a planarized TEOS oxide layer;

patterning said planarized TEOS oxide layer, said upper capping layer, said treated fluorinated silica glass dielectric layer, and said liner layer to form a via hole therethrough exposing a portion of said metal structure and exposing sidewalls of said patterned treated fluorinated silica glass dielectric layer within said via opening;

treating at least said exposed sidewalls of said patterned treated fluorinated silica glass dielectric layer within said via opening with a second nitrogen gas/plasma treatment to form a fluorine depleted sidewall capping layer (34) from said exposed sidewalls of said patterned treated fluorinated silica glass dielectric layer; wherein said upper and sidewall capping layers prevent said outgassing from said patterned fluorinated silica glass dielectric layer; and forming a metal interconnect within said via opening.

2. The method of claim 1, wherein said fluorinated silica glass dielectric layer has a F concentration from about 4 to 10 atom %; said upper capping layer has a F concentration from about 0 to 0.2 atom %; and said sidewall capping layer has a F concentration from about 0 to 0.2 atom %.

3. The method of claim 1, wherein said fluorinated silica glass dielectric layer has a F concentration from about 5 to 8 atom %; said upper capping layer has a F concentration from about 0 to 0.1 atom %; and said sidewall capping layer has a F concentration from about 0 to 0.1 atom %.

4. The method of claim 1, wherein the F concentration in said upper capping layer is from about 0 to 2% of the F concentration in said fluorinated silica glass dielectric layer, and the F concentration in said sidewall capping layer is from about 0 to 2% of the F concentration in said fluorinated silica glass dielectric layer (16).

5. The method of claim 1, wherein the F concentration in said upper capping layer is from about 0 to 0.66% of the F concentration in said fluorinated silica glass dielectric layer, and the F concentration in said sidewall capping layer is from about 0 to 0.66% of the F concentration in said fluorinated silica glass dielectric layer.

6. The method of claim 1, wherein said liner layer is comprised of a material selected from the group consisting of USG, PSG, BPSG, and SRO, and is from about 100 to 700 Å thick.

7. The method of claim 1, wherein said liner layer is comprised of SRO, and is from about 200 to 500 Å thick.

8. The method of claim 1, wherein said liner layer is from about 100 to 700 Å thick; said fluorinated silica glass layer is from about 4000 to 10,000 Å thick; said TEOS oxide layer is from about 14,000 to 18,000 Å thick; and said planarized TEOS oxide layer is from about 1000 to 5000 Å thick.

9. The method of claim 1, wherein said liner layer is from about 200 to 500 Å thick; said fluorinated silica glass layer is from about 5000 to 9000 Å thick; said TEOS oxide layer is from about 15,000 to 17,000 Å thick; and said planarized TEOS oxide layer is from about 2000 to 4000 Å thick.

10. The method of claim 1, wherein said via hole is from about 1800 to 3000 Å wide.

11. The method of claim 1, wherein said via hole is from about 2000 to 2600 Å wide.

12. The method of claim 1, wherein said first and second N-containing plasma is a plasma selected from the group comprising an $N_2$ plasma, an $NH_3$ plasma, an $NH_2$—$NH_2$ plasma, and a combination of one or more of these said plasmas with each other or with an $H_2$ plasma, and said H-containing plasma is an $H_2$ plasma.

13. The method of claim 1, wherein said first nitrogen gas/plasma treatment includes an $NH_3/N_2$ gas mixture and is conducted at a power of from about 20 to 2000 W, for about 3 to 300 seconds.

14. The method of claim 1, wherein said first nitrogen gas/plasma treatment is conducted at a power of from about 50 to 1000 W, for from about 10 to 50 seconds.

15. The method of claim 1, wherein said fluorinated silica glass dielectric layer is formed by a method selected from the group comprising a PECVD method and a HDCVD method.

16. The method of claim 1, wherein said fluorinated silica glass dielectric layer 16 is formed by a PECVD method.

17. The method of claim 1, wherein said metal structure is comprised of a material selected from the group consisting of aluminum, copper, an Al/Cu alloy, and an Al/Cu/Si alloy; and said metal interconnect is comprised of a material selected from the group comprising aluminum, copper, and tungsten.

18. The method of claim 1, wherein said metal structure is comprised of aluminum; and said metal interconnect is comprised of tungsten.

19. A method of forming a metal interconnect within a fluorinated silica glass dielectric layer while preventing outgassing from said fluorinated silica glass dielectric layer, comprising the steps of:

provide a semiconductor structure having a metal structure formed thereover;

forming a liner layer over said semiconductor structure, covering said metal structure; said liner layer being from about 100 to 700 Å thick;

forming a fluorinated silica glass dielectric layer over said liner layer; said fluorinated silica glass dielectric layer having an exposed upper surface; said fluorinated silica glass dielectric layer being from about 4000 to 10,000 Å thick;

treating said fluorinated silica glass dielectric layer with a first nitrogen gas/plasma treatment to form a fluorine depleted upper capping layer from said exposed surface of said fluorinated silica glass dielectric layer;

forming a TEOS oxide layer over said upper capping layer; said TEOS oxide layer being from about 14,000 to 18,000 Å thick;

planarizing said TEOS oxide layer to form a planarized TEOS oxide layer; said planarized TEOS oxide layer being from about 1000 to 5000 Å thick;

patterning said planarized TEOS oxide layer, said upper capping layer, said treated fluorinated silica glass dielectric layer, and said liner layer to form a via hole therethrough exposing a portion of said metal structure and exposing sidewalls of said patterned treated fluorinated silica glass dielectric layer within said via opening; said via hole being from about 1800 to 3000 Å wide;

treating at least said exposed sidewalls of said patterned treated fluorinated silica glass dielectric layer within said via opening with a second nitrogen gas/plasma treatment to form a fluorine depleted sidewall capping layer from said exposed sidewalls of said patterned treated fluorinated silica glass dielectric layer; wherein said upper and sidewall capping layers prevent said outgassing from said patterned fluorinated silica glass dielectric layer; and forming a metal interconnect within said via opening.

20. The method of claim 19, wherein said fluorinated silica glass dielectric layer has a F concentration from about 4 to 10 atom %; said upper capping layer has a F concentration from about 0 to 0.2 atom %; and said sidewall capping layer has a F concentration from about 0 to 0.2 atom %.

21. The method of claim 19, wherein said fluorinated silica glass dielectric layer has a F concentration from about 5 to 8 atom %; said upper capping layer has a F concentration from about 0 to 0.1 atom %, and said sidewall capping layer has a F concentration from about 0 to 0.1 atom %.

22. The method of claim 19, wherein the F concentration in said upper capping layer is from about 0 to 2% of the F concentration in said fluorinated silica glass dielectric layer, and the F concentration in said sidewall capping layer is from about 0 to 2% of the F concentration in said fluorinated silica glass dielectric layer.

23. The method of claim 19, wherein the F concentration in said upper capping layer is from about 0 to 0.66% of the F concentration in said fluorinated silica glass dielectric layer, and the F concentration in said sidewall capping layer is from about 0 to 0.66% of the F concentration in said fluorinated silica glass dielectric layer.

24. The method of claim 19, wherein said liner layer is comprised of a material selected from the group consisting of USG, PSG, BPSG, and SRO, and is from about 200 to 500 Å thick.

25. The method of claim 19, wherein said liner layer is comprised of SRO.

26. The method of claim 19, wherein said liner layer is from about 200 to 500 Å thick; said fluorinated silica glass layer is from about 5000 to 9000 Å thick; said TEOS oxide layer is from about 15,000 to 17,000 Å thick; and said planarized TEOS oxide layer is from about 2000 to 4000 Å thick.

27. The method of claim 19, wherein said via hole is from about 2000 to 2600 Å wide.

28. The method of claim 19, wherein said first and second N-containing plasma is a plasma selected from the group comprising an $N_2$ plasma, an $NH_3$ plasma, an $NH_2$—$NH_2$ plasma, and a combination of one or more of these said plasmas with each other or with an $H_2$ plasma, and said H-containing plasma is an $H_2$ plasma.

29. The method of claim 19, wherein said first and second nitrogen gas/plasma treatment each include an $NH_3/N_2$ gas mixture and are conducted at a power of from about 20 to 2000 W, for about 3 to 300 seconds.

30. The method of claim 19, wherein said first and second nitrogen gas/plasma treatments are each conducted at a power of from about 50 to 1000 W, for from about 10 to 50 seconds.

31. The method of claim 19, wherein said fluorinated silica glass dielectric layer is formed by a method selected from the group comprising a PECVD method and a HDCVD method.

32. The method of claim 19, wherein said fluorinated silica glass dielectric layer is formed by a PECVD method.

33. The method of claim 19, wherein said metal structure is comprised of a material selected from the group consisting of aluminum, copper, an Al/Cu alloy, and an Al/Cu/Si alloy; and said metal interconnect is comprised of a material selected from the group consisting of aluminum, copper, and tungsten.

34. A method of forming a metal interconnect within a fluorinated silica glass dielectric layer while preventing outgassing from said fluorinated silica glass dielectric layer, comprising the steps of:

providing a semiconductor structure having an aluminum metal line formed thereover;

forming an SRO liner layer over said semiconductor structure, covering said aluminum metal line; said SRO liner layer being from about 100 to 700 Å thick;

forming a fluorinated silica glass dielectric layer over said SRO liner layer; said fluorinated silica glass dielectric layer having an exposed upper surface; said fluorinated silica glass dielectric layer being from about 4000 to 10,000 Å thick;

treating said fluorinated silica glass dielectric layer with a first nitrogen gas/plasma treatment to form a fluorine depleted upper capping layer from said exposed surface of said fluorinated silica glass dielectric layer; said first nitrogen gas/plasma treatment is a plasma selected from the group comprising an $N_2$ plasma, an $NH_3$ plasma, an $NH_2$—$NH_2$ plasma, and a combination of one or more of these said plasmas with each other or with an $H_2$ plasma, and said H-containing plasma is an $H_2$ plasma;

forming a TEOS oxide layer over said upper capping layer; said TEOS oxide layer being from about 14,000 to 18,000 Å thick;

planarizing said TEOS oxide layer to form a planarized TEOS oxide layer; said planarized TEOS oxide layer being from about 1000 to 5000 Å thick;

patterning said planarized TEOS oxide layer, said upper capping layer, said treated fluorinated silica glass dielectric layer, and said SRO liner layer to form a via hole therethrough exposing a portion of said metal structure and exposing sidewalls of said patterned treated fluorinated silica glass dielectric layer within said via opening; said via hole being from about 1800 to 3000 Å wide;

treating at least said exposed sidewalls of said patterned treated fluorinated silica glass dielectric layer within said via opening with a second nitrogen gas/plasma treatment to form a fluorine depleted sidewall capping layer from said exposed sidewalls of said patterned treated fluorinated silica glass dielectric layer; wherein said upper and sidewall capping layers prevent said outgassing from said patterned fluorinated silica glass dielectric layer; said second nitrogen gas/plasma treatment including an $NH_3/N_2$ gas mixture; and forming a metal interconnect within said via opening.

35. The method of claim 34, wherein said fluorinated silica glass dielectric layer has a F concentration from about 4 to 10 atom %; said upper capping layer has a F concentration from about 0 to 0.2 atom %; and said sidewall capping layer has a F concentration from about 0 to 0.2 atom %.

36. The method of claim 34, wherein said fluorinated silica glass dielectric layer has a F concentration from about 5 to 8 atom %; said upper capping layer has a F concentration from about 0 to 0.1 atom %; and said sidewall capping layer has a F concentration from about 0 to 0.1 atom %.

37. The method of claim 34, wherein the F concentration in said upper capping layer is from about 0 to 2% of the F concentration in said fluorinated silica glass dielectric layer, and the F concentration in said sidewall capping layer is from about 0 to 2% of the F concentration in said fluorinated silica glass dielectric layer.

38. The method of claim 34, wherein the F concentration in said upper capping layer is from about 0 to 0.66% of the F concentration in said fluorinated silica glass dielectric layer, and the F concentration in said sidewall capping layer is from about 0 to 0.66% of the F concentration in said fluorinated silica glass dielectric layer.

39. The method of claim 34, wherein said SRO liner layer is from about 200 to 500 Å thick; said fluorinated silica glass layer is from about 5000 to 9000 Å thick; said TEOS oxide layer is from about 15,000 to 17,000 Å thick; and said planarized TEOS oxide layer is from about 2000 to 4000 Å thick.

40. The method of claim 34, wherein said via hole is from about 2000 to 2600 Å wide.

41. The method of claim 34, wherein said first and second nitrogen gas/plasma treatment each include an $NH_3/N_2$ gas mixture and are conducted at a power of from about 20 to 2000 W, for about 3 to 300 seconds.

42. The method of claim 34, wherein said fluorinated silica glass dielectric layer is formed by a method selected from the group comprising a PECVD method and a HDCVD method.

43. The method of claim 34, wherein said fluorinated silica glass dielectric layer is formed by a PECVD method.

44. The method of claim 34, wherein said metal interconnect is comprised of a material selected from the group comprising aluminum, copper and tungsten.

* * * * *

UNITED STATES PATENT AND TRADEMARK OFFICE
CERTIFICATE OF CORRECTION

PATENT NO. : 6,284,644 B1  
DATED : September 4, 2001  
INVENTOR(S) : Arthur Khoon Siah Ang, Feng Chen and Qiong Li Page 1 of 1

It is certified that error appears in the above-identified patent and that said Letters Patent is hereby corrected as shown below:

<u>Title page,</u>  
Item [75], Inventor's name should read -- Arthur Khoon Siah Ang --. Please delete "Aug".

Signed and Sealed this

Sixteenth Day of April, 2002

*Attest:*

JAMES E. ROGAN  
*Attesting Officer*     *Director of the United States Patent and Trademark Office*